United States Patent
Shih et al.

(10) Patent No.: US 9,936,599 B1
(45) Date of Patent: Apr. 3, 2018

(54) ASSEMBLY MECHANISM ADAPTED TO A SERVER SYSTEM AND SERVER SYSTEM THEREWITH

(71) Applicants: Inventec (Pudong) Technology Corp., Shanghai (CN); Inventec Corporation, Taipei (TW)

(72) Inventors: Yi-Chun Shih, Taipei (TW); Yen-Cheng Lin, Taipei (TW); Hsin-Liang Chen, Taipei (TW); Chia-Chen Lu, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 15/469,601

(22) Filed: Mar. 27, 2017

(30) Foreign Application Priority Data

Nov. 28, 2016 (CN) .......................... 2016 1 1064087

(51) Int. Cl.
*G06F 1/16* (2006.01)
*H05K 5/00* (2006.01)
*H05K 7/14* (2006.01)
*H05K 5/02* (2006.01)

(52) U.S. Cl.
CPC ........... *H05K 7/1401* (2013.01); *H05K 5/023* (2013.01); *H05K 5/0204* (2013.01); *H05K 7/1487* (2013.01); *H05K 7/1489* (2013.01)

(58) Field of Classification Search
CPC ...... H05K 5/02; H05K 5/0204; H05K 5/0221; H05K 5/0226; H05K 5/023; H05K 7/14; H05K 7/1401; H05K 7/1415; H05K 7/1485; H05K 7/1487; H05K 7/1488; H05K 7/1489; H05K 7/1427; H05K 7/1431
USPC .... 361/679.02, 679.57, 679.58, 679.59, 724, 361/725, 726, 727
See application file for complete search history.

(56) References Cited

U.S. PATENT DOCUMENTS

| | | | | |
|---|---|---|---|---|
| 5,481,431 | A * | 1/1996 | Siahpolo | G06F 1/184 361/679.31 |
| 5,641,296 | A * | 6/1997 | Larabell | G06F 1/184 439/157 |
| 7,405,966 | B2 * | 7/2008 | Seyyedy | G11C 11/15 257/E23.147 |
| 7,771,218 | B2 * | 8/2010 | Jaramillo | H05K 7/1492 439/157 |

(Continued)

*Primary Examiner* — Anthony Haughton
(74) *Attorney, Agent, or Firm* — Winston Hsu

(57) ABSTRACT

An assembly mechanism and a server system therewith are disclosed. The server system includes a casing, a first module and a second module. The first module is installed inside the casing. The second module is selectively installed inside the casing. The assembly mechanism includes a frame mechanism, a tray, a first fixing member and a handle member. The frame mechanism is disposed around the first module. The tray is combined with the second module and supports the second module above the first module cooperatively with the frame mechanism. The first fixing member is fixed on the frame mechanism. The handle member is pivoted to the tray. The handle member activates the tray to approach the first module as being rotated in a first direction. The handle member activates the tray to separate from the first module as being rotated in a second direction.

10 Claims, 11 Drawing Sheets

(56) References Cited

U.S. PATENT DOCUMENTS

| | | | | |
|---|---|---|---|---|
| 8,089,770 B2* | 1/2012 | Olesiewicz | ............. | G06F 1/185 |
| | | | | 361/752 |
| 9,055,690 B2* | 6/2015 | Ross | ....................... | G06F 1/187 |
| 9,086,859 B2* | 7/2015 | Attlesey | .................... | G06F 1/20 |
| 9,335,802 B2* | 5/2016 | Shelnutt | .................. | G06F 1/206 |
| 9,717,158 B2* | 7/2017 | Della Fiora | .......... | H05K 7/1487 |
| 9,773,526 B2* | 9/2017 | Shelnutt | ............... | G11B 33/142 |
| 9,826,658 B1* | 11/2017 | Mao | ..................... | H05K 7/1489 |
| 2005/0186816 A1* | 8/2005 | Franz | .............. | H01R 13/62933 |
| | | | | 439/157 |
| 2015/0327378 A1* | 11/2015 | Mao | ....................... | G06F 1/182 |
| | | | | 220/757 |

* cited by examiner

ASSEMBLY MECHANISM ADAPTED TO A SERVER SYSTEM AND SERVER SYSTEM THEREWITH

BACKGROUND OF THE INVENTION

1. Field of the Invention

The present invention relates to an assembly mechanism and a server system therewith, and more particularly, to an assembly mechanism adapted to a server system and a server system therewith.

2. Description of the Prior Art

In order to meet market demands, the server is evolved to have the specification thereof toward higher computing capability and large memory. In general, the capability of expansion of the server is a selective configuration. If the internal configuration of the server system has been filled with electronic components, the server expansion module is able to be disposed above and coupled to the original server module, so as to jointly run the large-scale system. When the server system is in response to the miniaturization system, the server expansion module is able to be removed for saving system resources.

However, due to the size and the weight of the server expansion module itself, it is not easy for operators to install and remove the server expansion module, which causes the server expansion module to easily collide with the internal parts of the server during the assembly process. As a result, it neither facilitates the assembly of the server expansion module, nor prevents the parts from damage due to collision during the assembly process.

SUMMARY OF THE INVENTION

The present invention provides an assembly mechanism adapted to a server system and with capability of preventing internal components of the server system from damage during assembly process and a server system therewith for solving above drawbacks.

According to an embodiment of the present invention, the present invention discloses an assembly mechanism adapted to a server system. The server system includes a casing, a first module and a second module. The first module and the second module are installed inside the casing. The assembly mechanism includes a frame mechanism, a tray, a first fixing member and a handle member. The frame mechanism is disposed inside the casing and in a periphery of the first module. The tray is combined with the second module and supports the second module above the first module cooperatively with the frame mechanism. The tray is detachably installed on the frame mechanism and includes a main tray body and a first pivot holding member. The first pivot holding member is disposed on the main tray body. The first fixing member is fixed on the frame mechanism. The handle member is pivoted to the tray. The handle member has a first cam portion and a second cam portion and includes a first linkage portion, a second linkage portion, a handle portion and a first pivotal member. An end of the first linkage portion and an end of the second linkage portion are respectively connected to opposite ends of the handle portion. The first linkage portion is pivoted to the first pivot holding member by the first pivotal member. The first cam portion and the second cam portion are disposed on another end of the first linkage portion. A distance between the first cam portion and the first pivotal member is smaller than a distance between the handle portion and the first pivotal member, and a distance between the second cam portion and the first pivotal member is smaller than a distance between the handle portion and the first pivotal member. The other end of the first linkage portion and another end of the second linkage portion are respectively pivoted to the tray, so that the first linkage portion, the handle portion and the second linkage portion are connected to one another and cooperatively form a U-shaped structure. The first cam portion abuts against and slides on the first fixing member when the handle member is rotated relative to the tray along a first rotating direction, so as to activate the tray to approach the first module and couple the second module with the first module. The second cam portion abuts against and slides on the first fixing member when the handle member is rotated relative to the tray along a second rotating direction opposite to the first rotating direction, so as to activate the tray to separate from the first module and decouple the second module from the first module.

According to another embodiment of the present invention, the tray further includes a second pivot holding member. The second pivot holding member is disposed on the main tray body. The handle member further includes a second pivotal member. The second linkage portion and the first linkage portion are symmetric relative to a geometric center of the handle portion, and the second linkage portion is pivoted to the second pivot holding member by the second pivotal member.

According to another embodiment of the present invention, the handle member has a third cam portion and a fourth cam portion. The third cam portion and the fourth cam portion are disposed on the other end of the second linkage portion, and the assembly mechanism further includes a second fixing member fixed on the frame mechanism. The third cam portion abuts against and slides on the second fixing member when the handle member is rotated relative to the tray along the first rotating direction, so as to activate the tray to approach the first module. The fourth cam portion abuts against and slides on the second fixing member when the handle member is rotated relative to the tray along the second rotating direction, so as to activate the tray to separate from the first module, wherein the second pivotal member is coaxial with the first pivotal member, and the second fixing member is coaxial with the first fixing member.

According to another embodiment of the present invention, a first containing space, a second containing space and a third containing space are formed between the tray and the second module. The first containing space, the second containing space and the third containing space communicate with one another. The first containing space, the second containing space and the third containing space accommodate the first linkage portion, the second linkage portion and the handle portion when the handle member is rotated to an accommodating position along the first rotating direction.

According to another embodiment of the present invention, the assembly mechanism further includes a push-push latch mechanism disposed on the handle portion. The push-push latch mechanism is for latching the handle portion in the third containing space or releasing the handle portion from the third containing space.

According to another embodiment of the present invention, a server system is disclosed and includes a casing, a first module, a second module and an assembly mechanism. The first module and the second module are installed inside the casing. The assembly mechanism includes a frame mechanism, a tray, a first fixing member and a handle member. The frame mechanism is disposed inside the casing and in a periphery of the first module. The tray is combined with the second module and supports the second module above the first module cooperatively with the frame mechanism. The tray is detachably installed on the frame mechanism and includes a main tray body and a first pivot holding member. The first pivot holding member is disposed on the main tray body. The first fixing member is fixed on the frame mechanism. The handle member is pivoted to the tray. The handle member has a first cam portion and a second cam portion and includes a first linkage portion, a second linkage portion, a handle portion and a first pivotal member. An end of the first linkage portion and an end of the second linkage portion are respectively connected to opposite ends of the handle portion. The first linkage portion is pivoted to the first pivot holding member by the first pivotal member. The first cam portion and the second cam portion are disposed on another end of the first linkage portion. A distance between the first cam portion and the first pivotal member is smaller than a distance between the handle portion and the first pivotal member, and a distance between the second cam portion and the first pivotal member is smaller than a distance between the handle portion and the first pivotal member. The other end of the first linkage portion and another end of the second linkage portion are respectively pivoted to the tray, so that the first linkage portion, the handle portion and the second linkage portion are connected to one another and cooperatively form a U-shaped structure. The first cam portion abuts against and slides on the first fixing member when the handle member is rotated relative to the tray along a first rotating direction, so as to activate the tray to approach the first module and couple the second module with the first module. The second cam portion abuts against and slides on the first fixing member when the handle member is rotated relative to the tray along a second rotating direction opposite to the first rotating direction, so as to activate the tray to separate from the first module and decouple the second module from the first module.

In summary, the handle member of the present invention has two linkage portion with respectively connection to opposite sides of the tray and the handle portion with connection to the two linkage portions, and each of the two linkage portions of the handle member of the present invention has the cam portions in cooperation with the fixing members. When the handle member is rotated along the first rotating direction, the cam portions of the handle member cooperates with the fixing members, so as to force the two opposite sides of the tray for stably approaching the tray with the second module to the first module. When the handle member is rotated along the second rotating direction opposite to the first rotating direction, the cam portions of the handle member cooperates with the fixing members, so as to force the two opposite sides of the tray for stably separating the tray with the second module from the first module. In such a manner, the assembly mechanism of the present invention is able to provide the two opposite sides of the tray with pressing force or lifting force when the tray with the second module approaches to or separate from the first module. As a result, it causes that the tray with the second module stably approach the first module or separate from the first module, so as to prevent internal components of the server system from damage during the assembly process.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part hereof, and in which is shown by way of illustration specific embodiments in which the invention may be practiced. In this regard, directional terminology, such as "top," "bottom," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "installed" and variations thereof herein are used broadly and encompass direct and indirect connections and installations. Accordingly, the drawings and descriptions will be regarded as illustrative in nature and not as restrictive.

Figure 1:
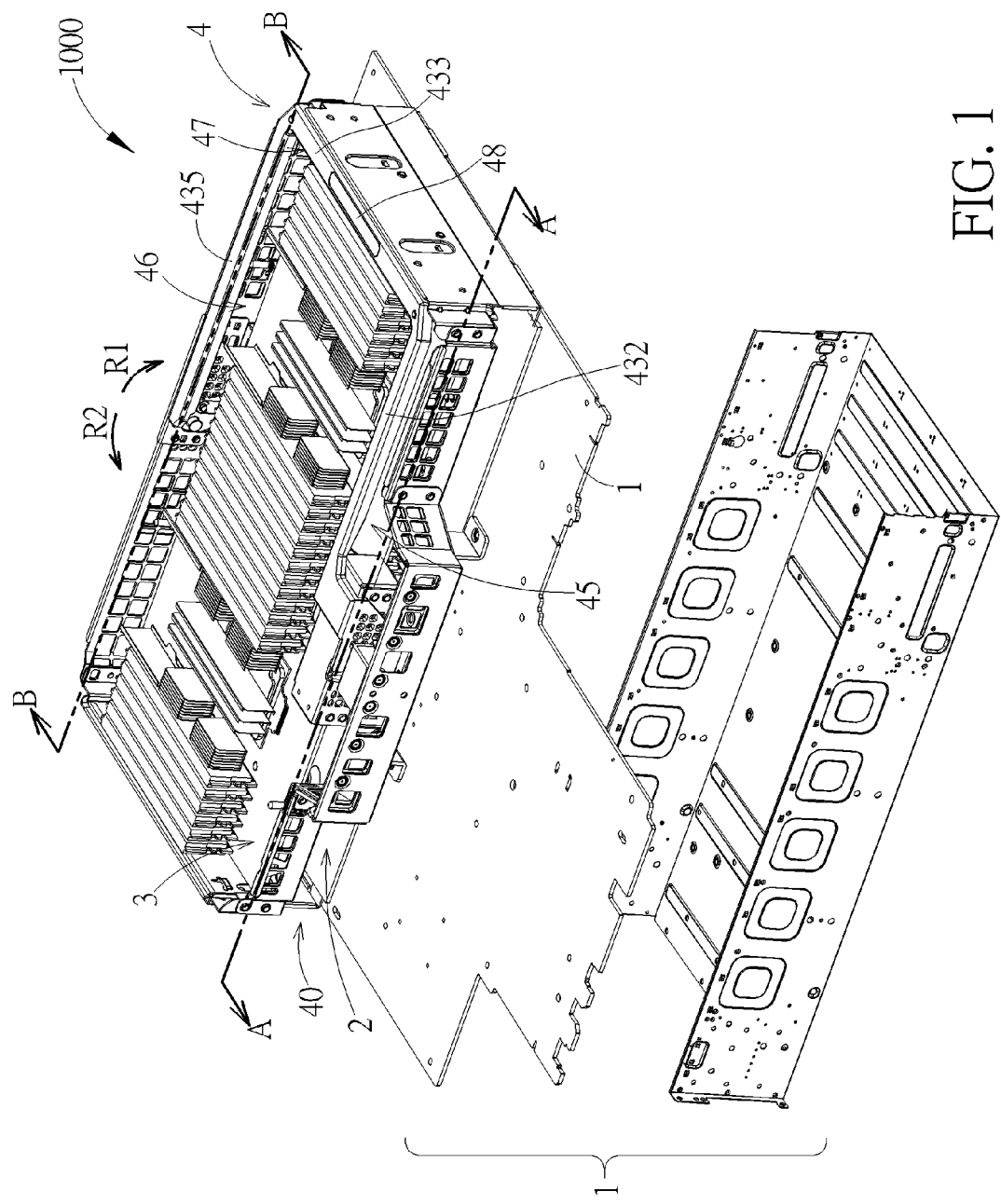
FIG. 1 is an exploded diagram of a server system according to an embodiment of the present invention.

Please refer to FIG. 1. FIG. 1 is an exploded diagram of a server system 1000 according to an embodiment of the present invention. As shown in FIG. 1, the server system 1000 includes a casing 1, a first module 2, a second module 3 and an assembly mechanism 4. The first module 2 is installed inside the casing 1. The assembly mechanism 4 is for ensuring the second module 3 to detachably disposed above the casing 1. Accordingly, the second module 3 is able to be selectively installed inside the casing 1 for meeting different system demands. It should be noticed that, in this embodiment, the casing 1 can include an assembly plate and an outer housing. During assembly process, the first module 2, the second module 3 and the assembly mechanism 4 can be assembled with the assembly plate in advance, and then the first module 2, the second module 3, the assembly mechanism 4 together with the assembly plate are assembled with the outer housing.

Figure 2:
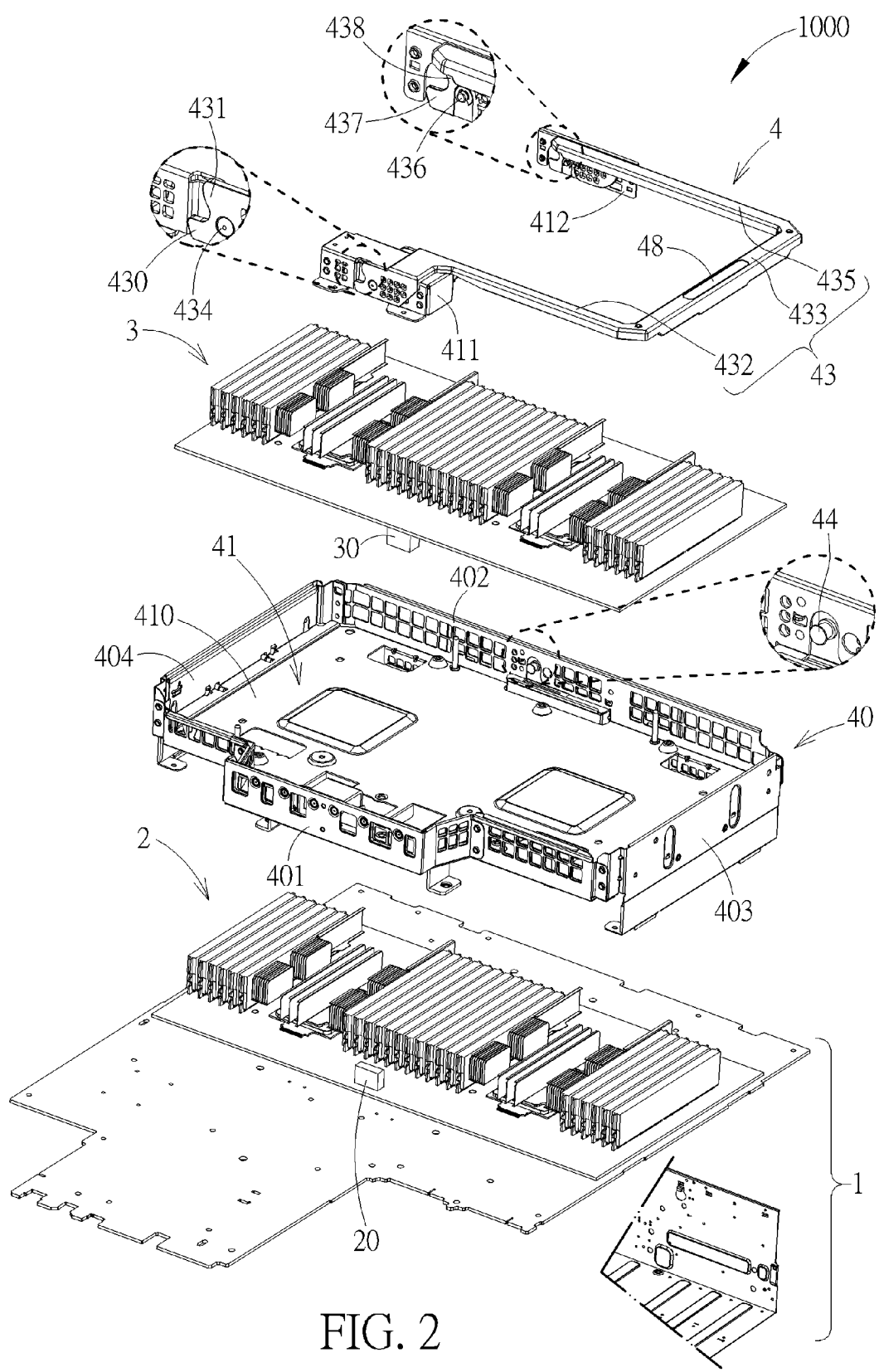
FIG. 2 is an exploded diagram of a first module, a second module and an assembly mechanism according to the embodiment of the present invention.
Figure 3:
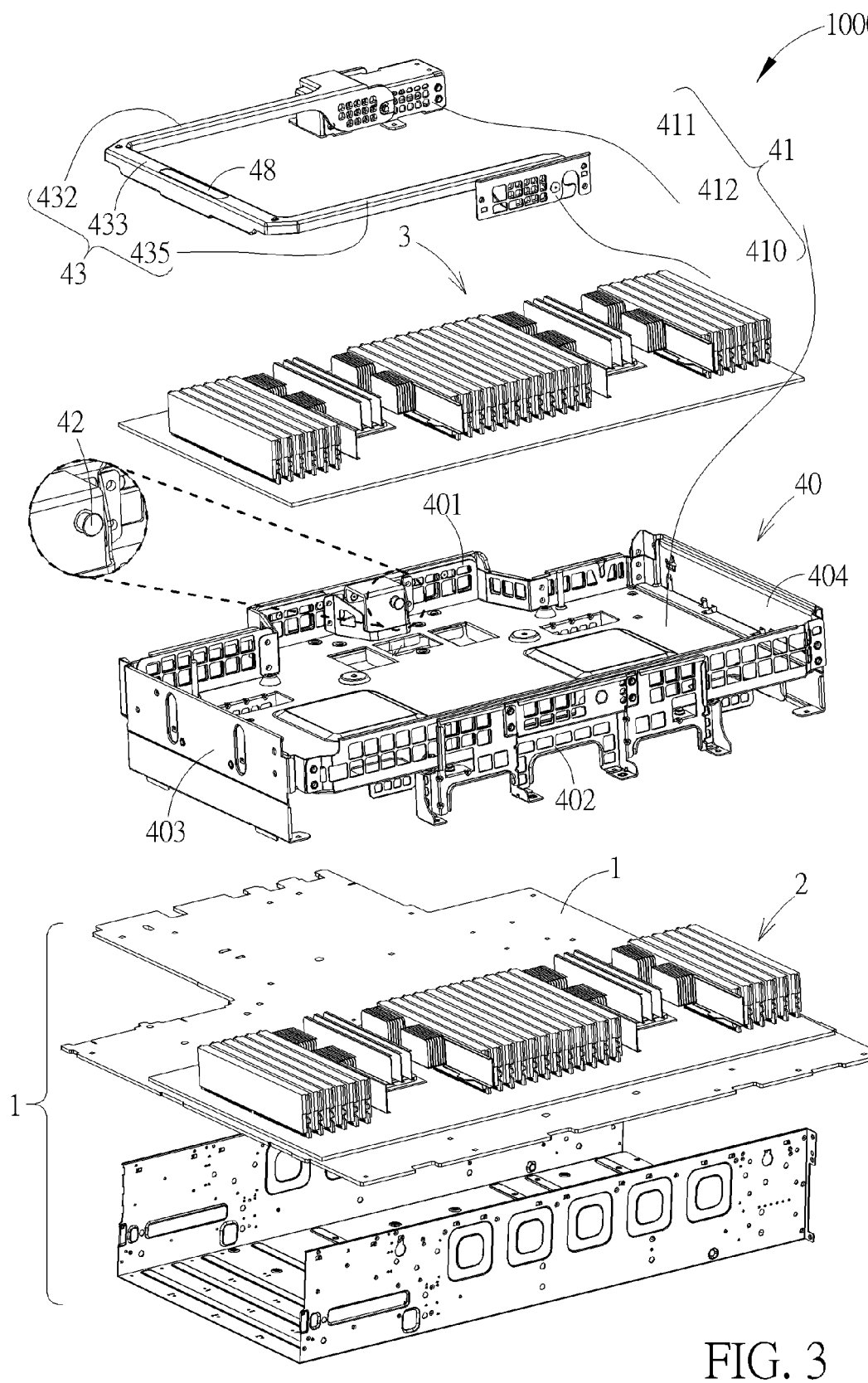
FIG. 3 is an exploded diagram of the first module, the second module and the assembly mechanism in another view according to the embodiment of the present invention.

Please refer to FIG. 1 to FIG. 3. FIG. 2 is an exploded diagram of the first module 2, the second module 3 and the assembly mechanism 4 according to the embodiment of the present invention. FIG. 3 is an exploded diagram of the first module 2, the second module 3 and the assembly mechanism 4 in another view according to the embodiment of the present invention. As shown in FIG. 1 to FIG. 3, the assembly mechanism 4 includes a frame mechanism 40, a tray 41, a first fixing member 42, a handle member 43 and a second fixing member 44. The frame mechanism 40 is disposed inside the casing 1 and in a peripheral of the first module 2. In this embodiment, the frame mechanism 40 includes a first frame 401, a second frame 402, a third frame 403 and a fourth frame 404. The first frame 401 is opposite to the second frame 402. The third frame 403 connects an end of the first frame 401 with an end of the second frame 402. The fourth frame 404 connects another end of the first frame 401 with another end of the second frame 402, i.e., the frame mechanism 40 are a substantially rectangular frame connected by the first frame 401, the second frame 402, the third frame 403 and the fourth frame 404. The tray 41 is combined with the second module 3. The first fixing member 42 is fixed on the first frame 401 of the frame mechanism 40, and the second fixing member 44 is fixed on the second frame 402 of the frame mechanism 40, i.e., the first fixing member 42 and the second fixing member 44 are respectively located on two opposite side of the frame mechanism 40. The handle member 43 is pivoted to the tray 41, so that the handle member 43 is able to rotate relative to the tray 41 along a first rotating direction R1 or the handle member 43 is able to rotate relative to the tray 41 along a second rotating direction R2 opposite to the first rotating direction R1.

Furthermore, the tray 41 includes a main tray body 410, a first pivot holding member 411 and a second pivot holding member 412. The first pivot holding member 411 and the second pivot holding member 412 are disposed on the main tray body 410. The handle member 43 includes a first cam portion 430, a second cam portion 431, a third cam portion 437 and a fourth cam portion 438. The handle member 43 includes a first linkage portion 432, a handle portion 433, a first pivotal member 434, a second linkage portion 435, a second pivotal member 436. An end of the first linkage portion 432 is connected to the handle portion 433. The first cam portion 430 and the second cam portion 431 are disposed at another end of the first linkage portion 432, and the first linkage portion 432 is pivoted to the first pivot holding member 411 by the first pivotal member. An end of the second linkage portion 43 is connected to the handle portion 433. The third cam portion 437 and the fourth cam portion 438 are disposed on another end of the second linkage portion 43. The second linkage portion 43 is pivoted to the second pivot holding member 412 by the second pivotal member 436. In other words, the end of the first linkage portion 432 and the end of the second linkage portion 43 are respectively connected to the opposite ends of the handle portion 433, and the other end of the first linkage portion 432 and the other end of the second linkage portion 43 are respectively connected to the first pivot holding member 411 and the second pivot holding member 412 of the tray 41.

In such a manner, when a user utilizes the handle portion 433 to rotate the handle member 43, the handle portion 433 is able to simultaneously activate the first linkage portion 432 to rotate relative to the first pivot holding member 411 by the first pivotal member 434 and the second linkage portion 43 to rotate relative to the second pivot holding member 412 by the second pivotal member 436. In this embodiment, the handle member 43 is a substantially U-shaped structure which is formed by connection among the first linkage portion 432, the handle portion 433 and the second linkage portion 43. It should be noticed that a first containing space 45, a second containing space 46 and a third containing space 47 are formed between the tray 41 and the second module 3. The first containing space 45, the second containing space 46 and the third containing space 47 communicate with one another. Accordingly, when the handle member 43 is rotated to an accommodating position shown in FIG. 1, the first containing space 45, the second containing space 46 and the third containing space 47 accommodate the first linkage portion 432, the second linkage portion 43 and the handle portion 433, respectively.

In addition, the assembly mechanism 4 further includes a push-push latch mechanism 48. The push-push latch mechanism 48 is disposed on the handle portion 433 of the handle member 43. When the handle member 43 is rotated to the accommodating position along the first rotating direction R1, the push-push latch mechanism 48 is able to latch the handle portion 433 in the third containing space 47, so as to fix the handle member 43 in the accommodating position. When the handle member 43 is fixed in the accommodating position, the push-push latch mechanism 48 can be further pressed, so as to release the handle portion 433 from the third containing space 47 and the handle member 43 is able to separate from the accommodating position along the second rotating direction R2. In other words, the push-push latch mechanism 48 is used for selectively latching the handle portion 433 in the third containing space 47 or releasing the handle portion 433 from the third containing space 47.

Figure 4:
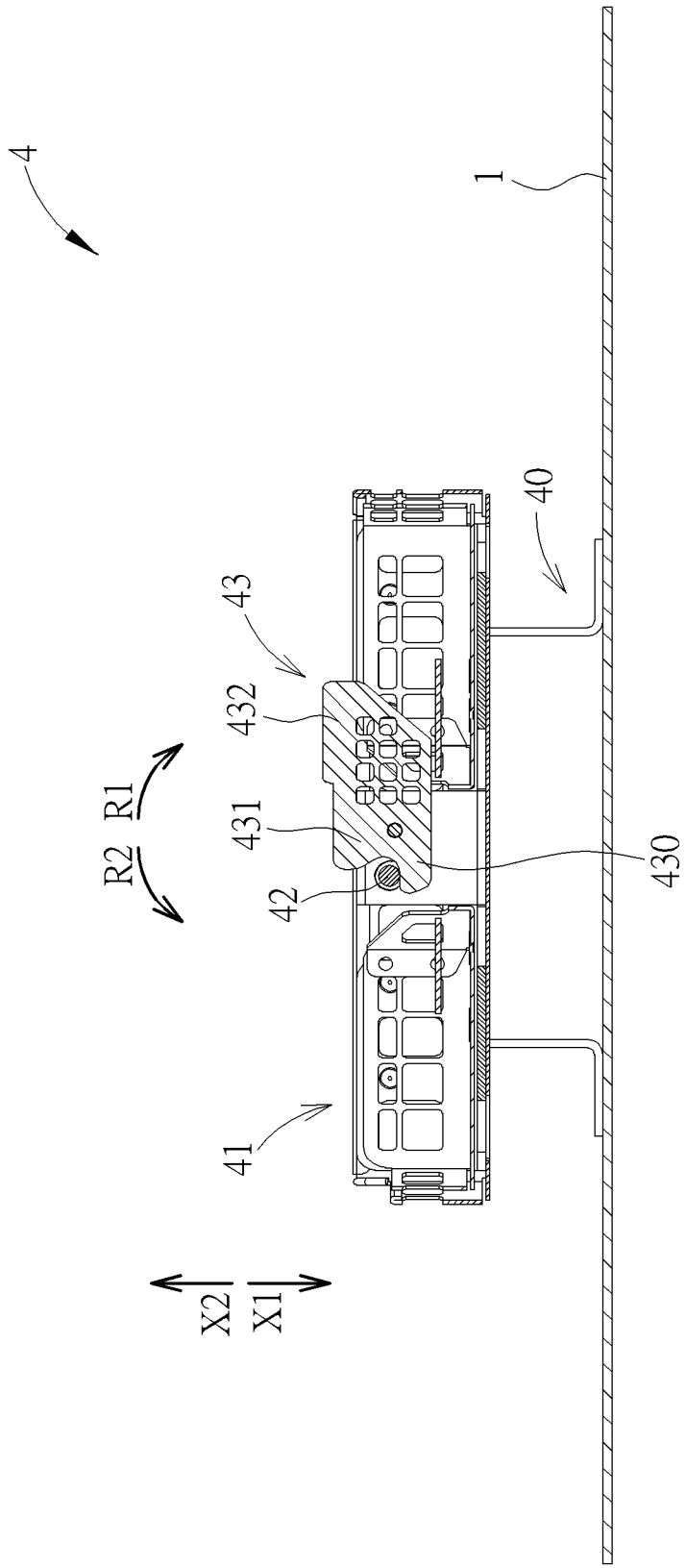
FIG. 4 is a sectional diagram of the assembly mechanism in FIG. 1 and taken along a section line A-A.
Figure 5:
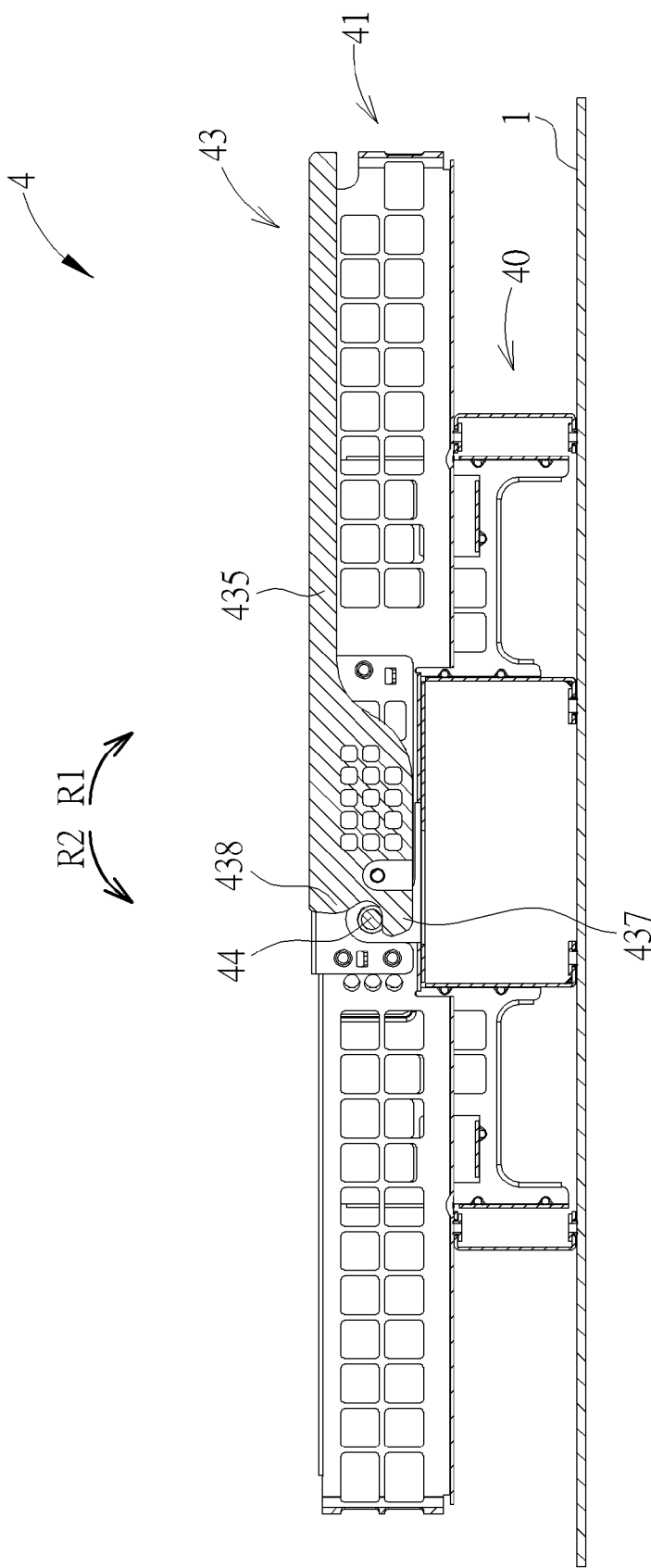
FIG. 5 is a sectional diagram of the assembly mechanism shown in FIG. 1 and taken along a section line B-B.
Figure 6:
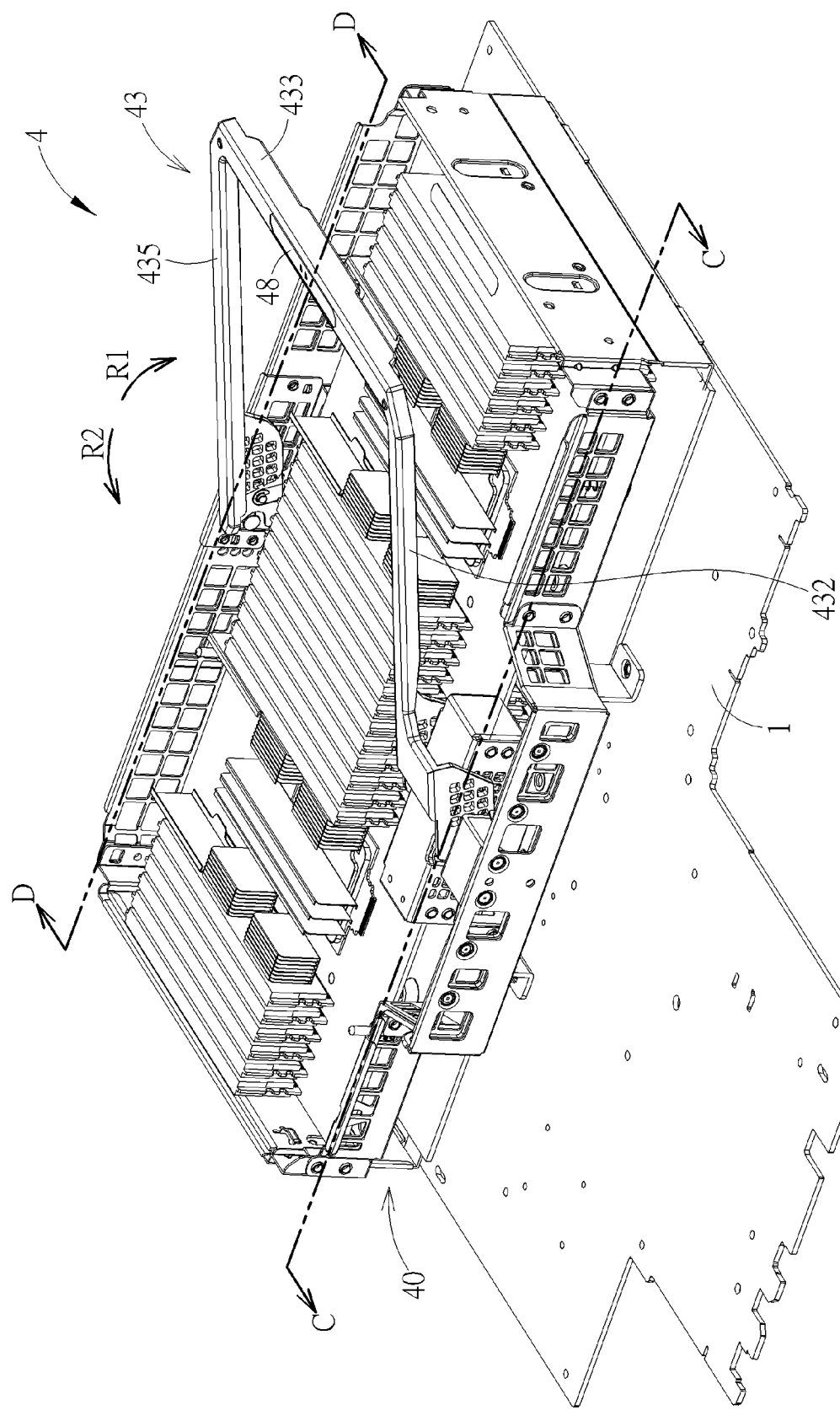
FIG. 6 is a diagram of the assembly mechanism in an intermediate state according to the embodiment of the present invention.
Figure 7:
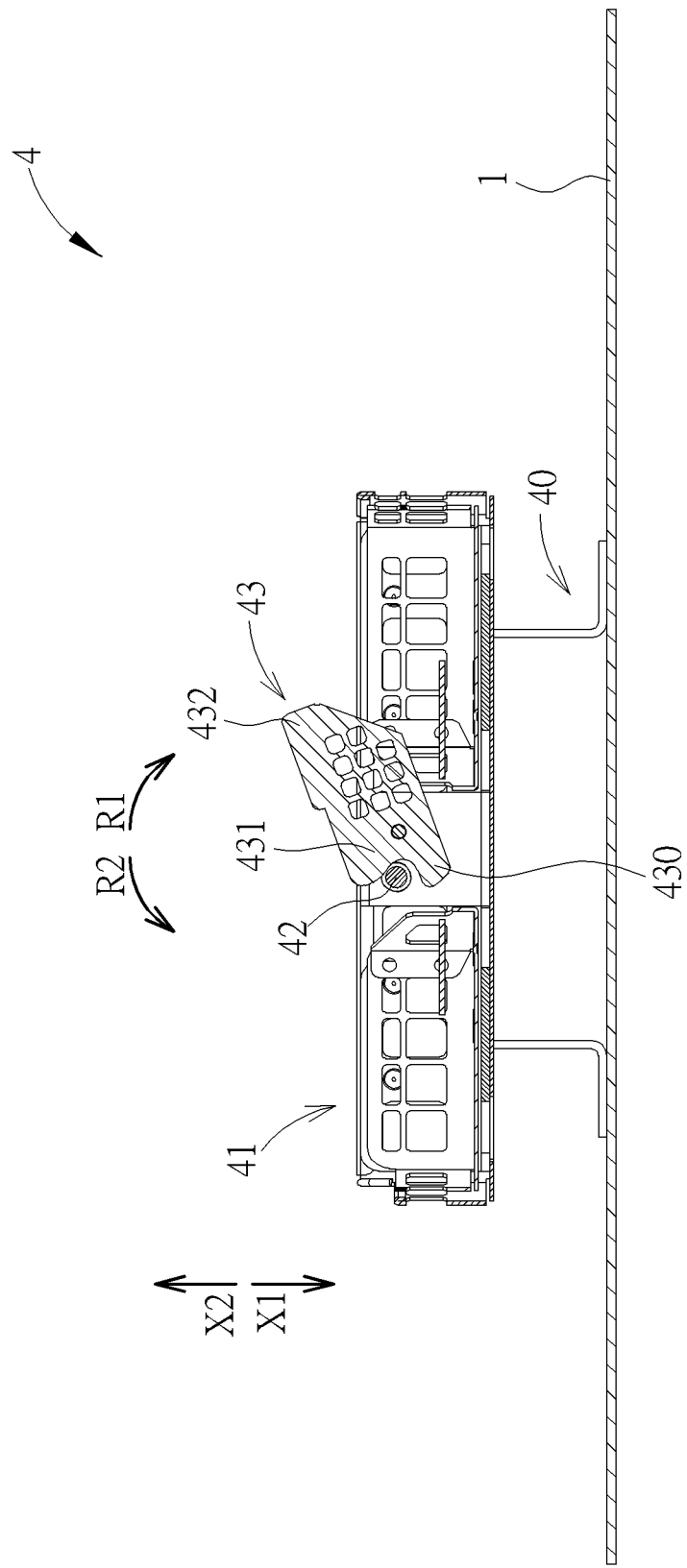
FIG. 7 is a sectional diagram of the assembly mechanism in FIG. 6 and taken along a section line C-C.
Figure 8:
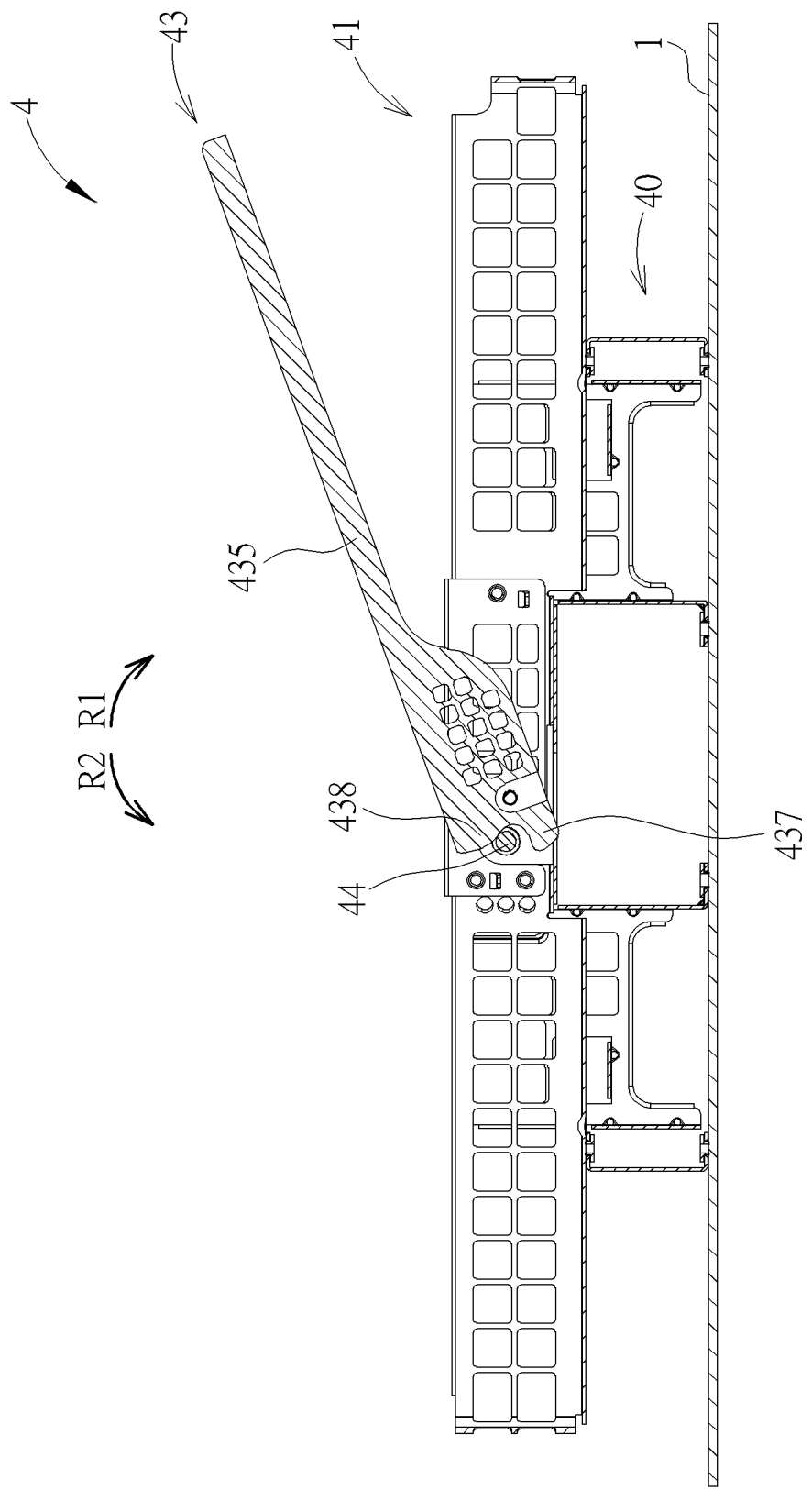
FIG. 8 is a sectional diagram of the assembly mechanism in FIG. 6 and taken along a section line D-D.
Figure 9:
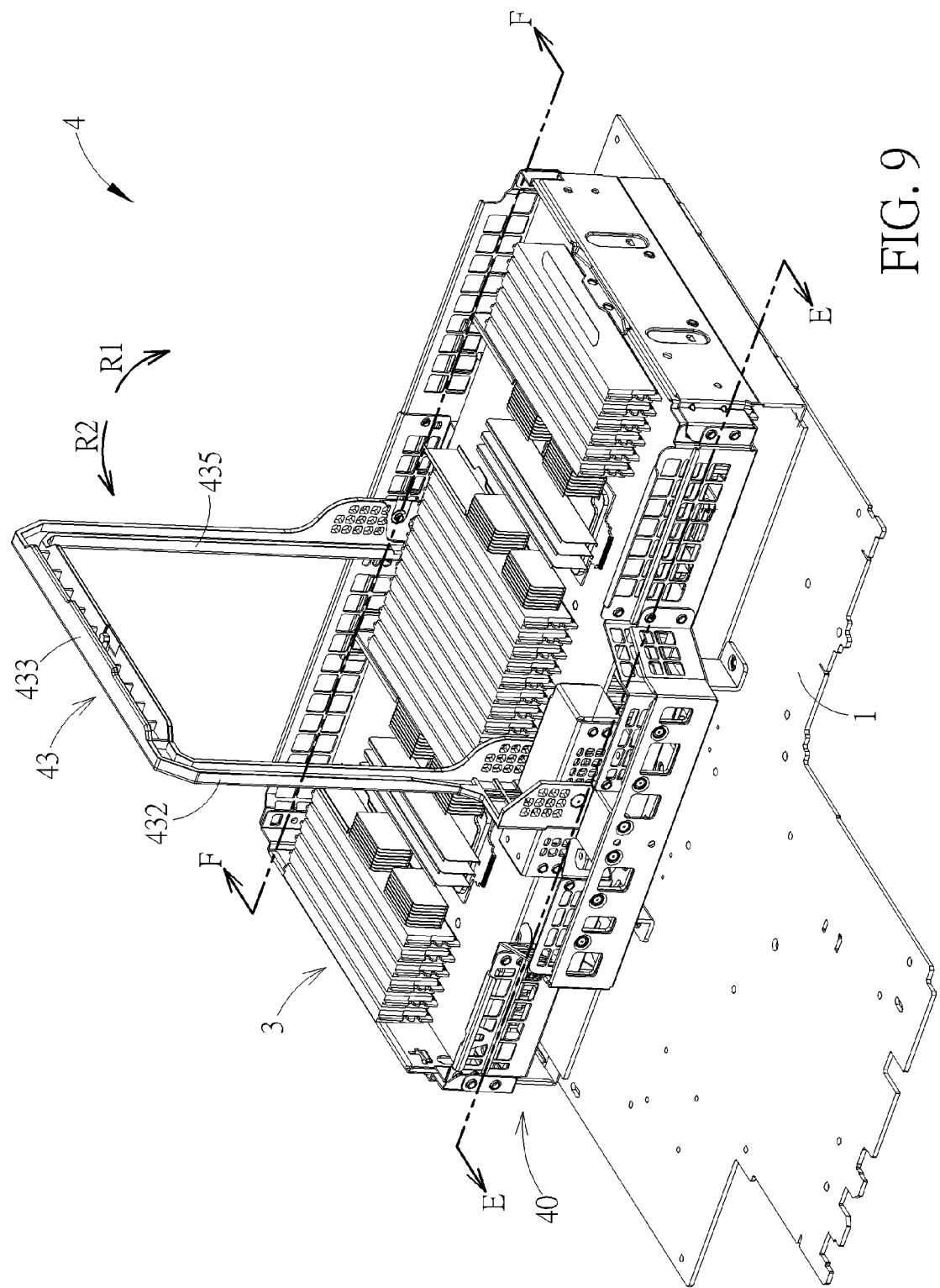
FIG. 9 is a diagram of the assembly mechanism in a releasing state according to the embodiment of the present invention.
Figure 10:
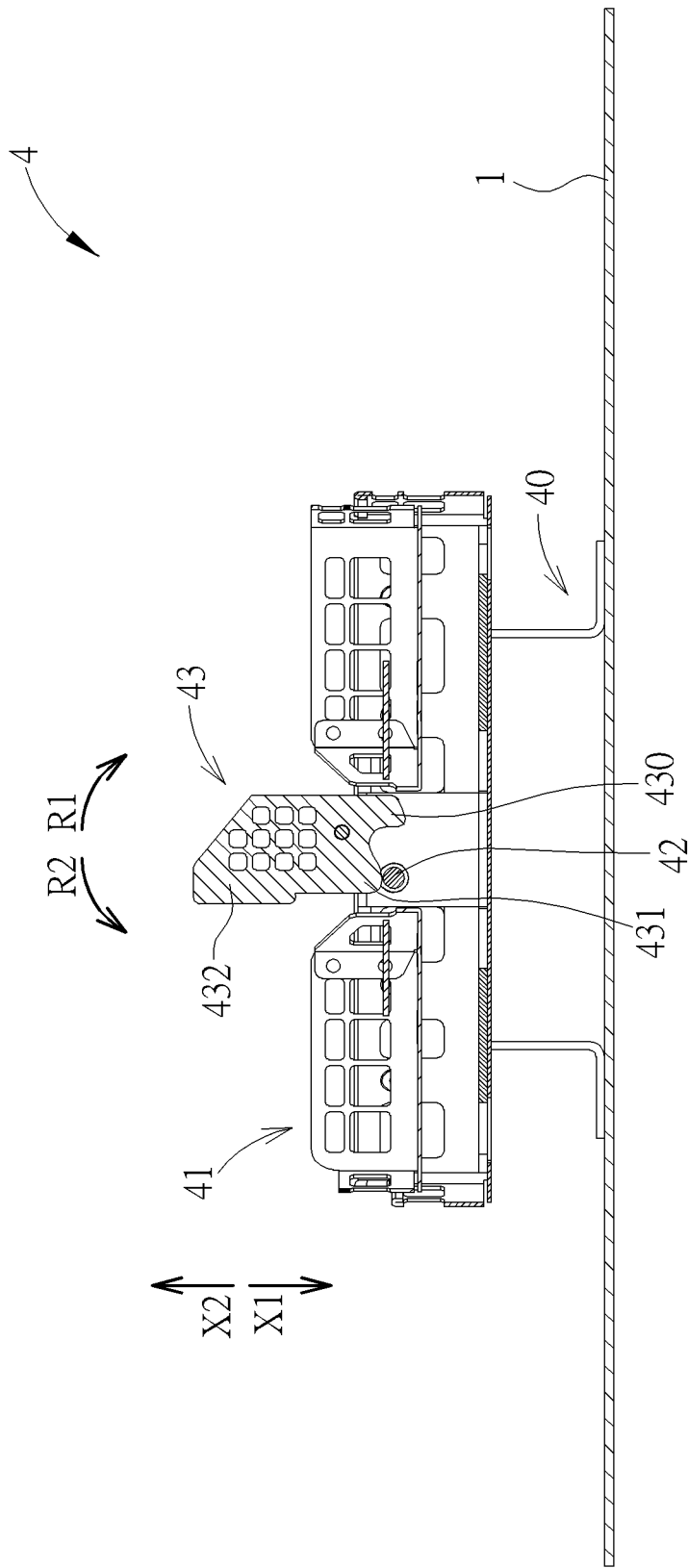
FIG. 10 is a sectional diagram of the assembly mechanism in FIG. 9 and taken along a section line E-E.
Figure 11:
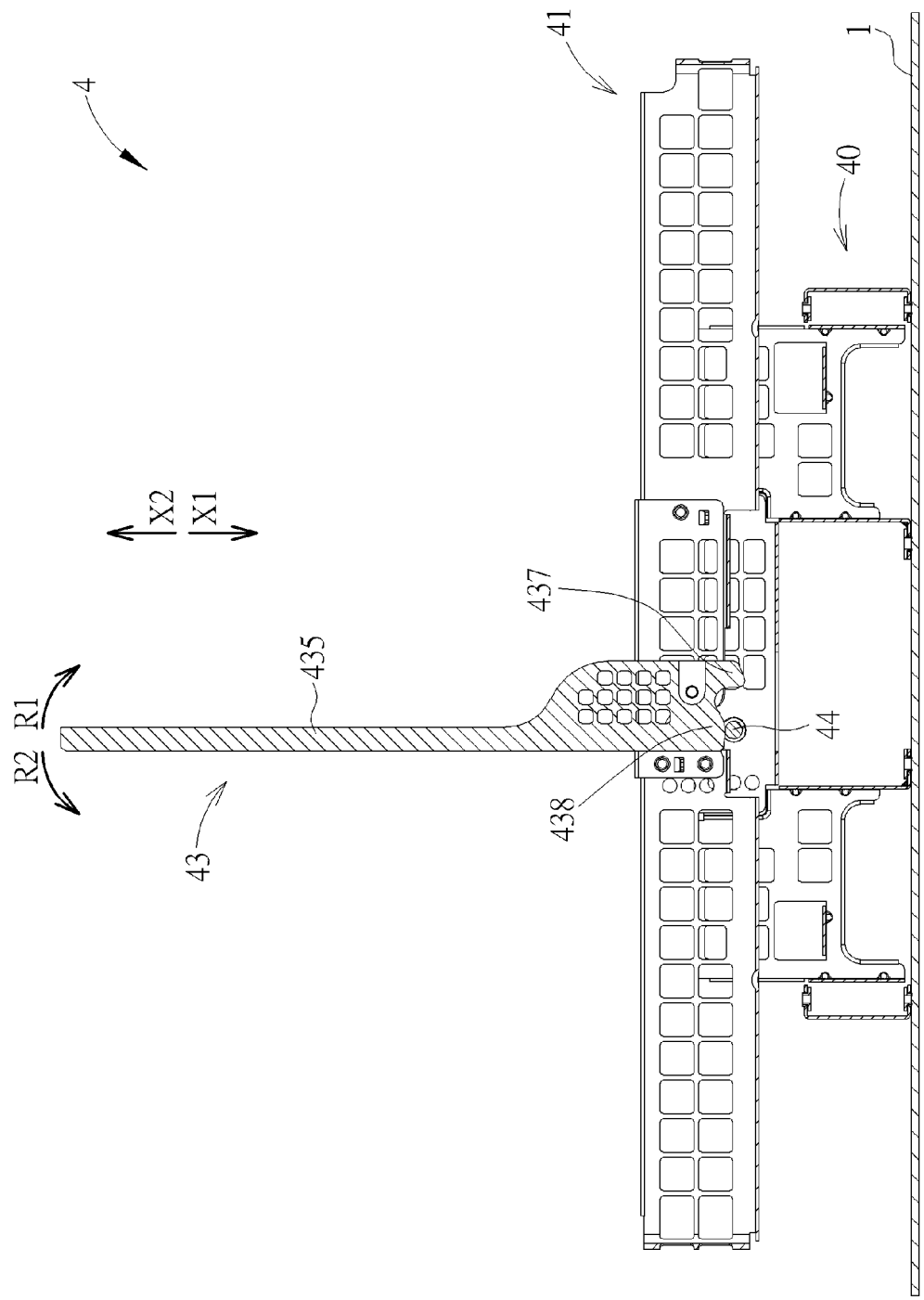
FIG. 11 is a sectional diagram of the assembly mechanism in FIG. 9 and taken along a section line F-F.

Please refer FIG. 1 to FIG. 11. FIG. 4 is a sectional diagram of the assembly mechanism 4 in FIG. 1 and taken along a section line A-A. FIG. 5 is a sectional diagram of the assembly mechanism 4 shown in FIG. 1 and taken along a section line B-B. FIG. 6 is a diagram of the assembly mechanism 4 in an intermediate state according to the embodiment of the present invention. FIG. 7 is a sectional diagram of the assembly mechanism 4 in FIG. 6 and taken along a section line C-C. FIG. 8 is a sectional diagram of the assembly mechanism 4 in FIG. 6 and taken along a section line D-D. FIG. 9 is a diagram of the assembly mechanism 4 in a releasing state according to the embodiment of the present invention. FIG. 10 is a sectional diagram of the assembly mechanism 4 in FIG. 9 and taken along a section line E-E. FIG. 11 is a sectional diagram of the assembly mechanism 4 in FIG. 9 and taken along a section line F-F. As shown in FIG. 1 to FIG. 11, when the assembly mechanism 4 is in a coupling state as shown in FIG. 1, the second module 3 is supported above the first module 2 by the tray 41 of the assembly mechanism 4 cooperatively with the frame mechanism 40. The first cam portion 430 and the third cam portion 437 of the handle member 43 respectively abut against the first fixing member 42 and the second fixing member 44, as shown in FIG. 4 and FIG. 5. A first connector 20 of the first module 2 is coupled to a second connector 30 of the second module 3, so that the first module 2 and the second module 3 of the server system 1000 are able to jointly run the large-scale system. When the tray 41 together with the second module 3 are desired to be detached from the frame mechanism 40, the handle portion 433 of the handle member 43 is utilized for rotating the handle member 43 relative to the tray 41 along the second rotating direction R2. Meanwhile, the first cam portion 430 and the third cam portion 437 are able to slide on the first fixing member 42 and the second fixing member 44, respectively, so that the first cam portion 430 and the third cam portion 437 gradually separate from the first fixing member 42 and the second fixing member 44.

When the handle member 43 is rotated to a position shown in FIG. 6 along the second rotating direction R2, the second cam portion 431 and the fourth cam portion 438 of the handle member 43 abut against the first fixing member 42 and the second fixing member 44, as shown in FIG. 7 and FIG. 8. When the handle member 43 is rotated from the position shown in FIG. 6 to a position shown in FIG. 9 along the second rotating direction R2, the second cam portion 431 and the fourth cam portion 438 slides on the first fixing member 42 and the second fixing member 44, so that the handle member 43 is able to activate the tray 41 to separate the first module 2 along a first direction X1 (i.e., an upward direction) by cooperation of the second cam portion 431 and the first fixing member 42 as well as cooperation of the fourth cam portion 438 and the second fixing member 44. Furthermore, when the handle member 43 is rotated to a position shown in FIG. 10, the second connector 30 of the second module 3 is decoupled from the first connector 20 of the first module 2, so that the tray 41 together with the second module 3 are detached from the frame mechanism 40, which is in response to the miniaturization system and saves system resource.

On the other hand, when the second module 3 is desired to be coupled to the first module 2, the second module 3 together with the tray 41 can be disposed in the position shown in FIG. 10. Meanwhile, the second cam portion 431 and the fourth cam portion 438 respectively abut against the first fixing member 42 and the second fixing member 44, as shown in FIG. 10 and FIG. 11. Afterwards, handle member 43 is rotated relative to the tray 41 along the first rotating direction R1. Meanwhile, the second cam portion 431 and the fourth cam portion 438 slide relative to the first fixing member 42 and the second fixing member 44 and gradually separate from the first fixing member 42 and the second fixing member 44.

When the handle member 43 is rotated from the position shown in FIG. 9 to the position shown in FIG. 6 along the first rotating direction R1, the first cam portion 430 and the third cam portion 437 of the handle member 43 abut against the first fixing member 42 and the second fixing member 44, as shown in FIG. 7 and FIG. 8. When the handle member 43 is rotated from the position in FIG. 6 toward the position in FIG. 6 along the first rotating direction R1, the first cam portion 430 and the third cam portion 437 slides on the first fixing member 42 and the second fixing member 44, so that the handle member 43 is able to activate the tray 41 to approach the first module 2 along a second direction X2 (i.e., a downward direction) by cooperation of the first cam portion 430 and the first fixing member 42 and cooperation of the third cam portion 437 and the second fixing member 44. Furthermore, when the handle member 43 is rotated to the position shown in FIG. 1, the second connector 30 of the second module 3 is able to be coupled to the first connector 20 of the first module 2.

It should be noticed that the second linkage portion 43 and the first linkage portion 432 of the handle member 43 of the present invention are symmetric to a geometric center of the handle portion 433, the second pivotal member 436 is coaxial with the first pivotal member 434, and the second fixing member 44 is coaxial with the first fixing member 42. Accordingly, it ensures that the first cam portion 430 of the first linkage portion 432 and the third cam portion 437 of the second linkage portion 43 simultaneously contact with the first fixing member 42 or with the second fixing member 44 as well as ensures that the second cam portion 431 of the first linkage portion 432 and the fourth cam portion 438 of the second linkage portion 43 simultaneously contact with the first fixing member 42 or with the second fixing member 44. In addition, a distance between the first cam portion 430 and the first pivotal member 434 is smaller than a distance between the handle portion 433 and the first pivotal member 434, and a distance between the second cam portion 431 and the first pivotal member 434 is smaller than a distance between the handle portion 433 and the first pivotal member 434. As known in relation between force and force arm, the aforesaid structures allow the purpose of force saving to be achieved.

Compared to the prior art, the handle member of the present invention has two linkage portion with respectively connection to opposite sides of the tray and the handle portion with connection to the two linkage portions, and each of the two linkage portions of the handle member of the present invention has the cam portions in cooperation with the fixing members. When the handle member is rotated along the first rotating direction, the cam portions of the handle member cooperates with the fixing members, so as to force the two opposite sides of the tray for stably approaching the tray with the second module to the first module. When the handle member is rotated along the second rotating direction opposite to the first rotating direction, the cam portions of the handle member cooperates with the fixing members, so as to force the two opposite sides of the tray for stably separating the tray with the second module from the first module. In such a manner, the assembly mechanism of the present invention is able to provide the two opposite sides of the tray with pressing force or lifting force when the tray with the second module approaches to or separate from the first module. As a result, it causes that the tray with the second module stably approach the first module or separate from the first module, so as to prevent internal components of the server system from damage during the assembly process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An assembly mechanism adapted to a server system, the server system comprising a casing, a first module and a second module, the first module and the second module being installed inside the casing, the assembly mechanism comprising:
   a frame mechanism disposed inside the casing and in a periphery of the first module;
   a tray combined with the second module and supporting the second module above the first module cooperatively with the frame mechanism, the tray being detachably installed on the frame mechanism and comprising:
a main tray body; and
a first pivot holding member disposed on the main tray body;
a first fixing member fixed on the frame mechanism; and
a handle member pivoted to the tray, the handle member having a first cam portion and a second cam portion, the handle member comprising:
a first linkage portion;
a second linkage portion;
a handle portion; and
a first pivotal member;
wherein an end of the first linkage portion and an end of the second linkage portion are respectively connected to opposite ends of the handle portion, the first linkage portion is pivoted to the first pivot holding member by the first pivotal member, the first cam portion and the second cam portion are disposed on another end of the first linkage portion, a distance between the first cam portion and the first pivotal member is smaller than a distance between the handle portion and the first pivotal member, and a distance between the second cam portion and the first pivotal member is smaller than a distance between the handle portion and the first pivotal member;
wherein the other end of the first linkage portion and another end of the second linkage portion are respectively pivoted to the tray, so that the first linkage portion, the handle portion and the second linkage portion are connected to one another and cooperatively form a U-shaped structure;
wherein the first cam portion abuts against and slides on the first fixing member when the handle member is rotated relative to the tray along a first rotating direction, so as to activate the tray to approach the first module and couple the second module with the first module, the second cam portion abuts against and slides on the first fixing member when the handle member is rotated relative to the tray along a second rotating direction opposite to the first rotating direction, so as to activate the tray to separate from the first module and decouple the second module from the first module.

2. The assembly mechanism of claim 1, wherein the tray further comprises a second pivot holding member, the second pivot holding member is disposed on the main tray body, the handle member further comprises a second pivotal member, the second linkage portion and the first linkage portion are symmetric relative to a geometric center of the handle portion, and the second linkage portion is pivoted to the second pivot holding member by the second pivotal member.

3. The assembly mechanism of claim 2, wherein the handle member has a third cam portion and a fourth cam portion, the third cam portion and the fourth cam portion are disposed on the other end of the second linkage portion, and the assembly mechanism further comprises:
a second fixing member fixed on the frame mechanism, the third cam portion abuts against and slides on the second fixing member when the handle member is rotated relative to the tray along the first rotating direction, so as to activate the tray to approach the first module, the fourth cam portion abuts against and slides on the second fixing member when the handle member is rotated relative to the tray along the second rotating direction, so as to activate the tray to separate from the first module, wherein the second pivotal member is coaxial with the first pivotal member, and the second fixing member is coaxial with the first fixing member.

4. The assembly mechanism of claim 1, wherein a first containing space, a second containing space and a third containing space are formed between the tray and the second module, the first containing space, the second containing space and the third containing space communicate with one another, and the first containing space, the second containing space and the third containing space accommodate the first linkage portion, the second linkage portion and the handle portion when the handle member is rotated to an accommodating position along the first rotating direction.

5. The assembly mechanism of claim 1, further comprising:
a push-push latch mechanism disposed on the handle portion, the push-push latch mechanism being for latching the handle portion in the third containing space or releasing the handle portion from the third containing space.

6. A server system, comprising:
a casing;
a first module installed inside the casing;
a second module installed inside the casing; and
an assembly mechanism, comprising:
a frame mechanism disposed inside the casing and in a periphery of the first module;
a tray combined with the second module and supporting the second module above the first module cooperatively with the frame mechanism, the tray being detachably installed on the frame mechanism and comprising:
a main tray body; and
a first pivot holding member disposed on the main tray body;
a first fixing member fixed on the frame mechanism; and
a handle member pivoted to the tray, the handle member having a first cam portion and a second cam portion, the handle member comprising:
a first linkage portion;
a second linkage portion;
a handle portion; and
a first pivotal member;
wherein an end of the first linkage portion and an end of the second linkage portion are respectively connected to opposite ends of the handle portion, the first linkage portion is pivoted to the first pivot holding member by the first pivotal member, the first cam portion and the second cam portion are disposed on another end of the first linkage portion, a distance between the first cam portion and the first pivotal member is smaller than a distance between the handle portion and the first pivotal member, and a distance between the second cam portion and the first pivotal member is smaller than a distance between the handle portion and the first pivotal member;
wherein the other end of the first linkage portion and another end of the second linkage portion are respectively pivoted to the tray, so that the first linkage portion, the handle portion and the second linkage portion are connected to one another and cooperatively form a U-shaped structure;
wherein the first cam portion abuts against and slides on the first fixing member when the handle member is rotated relative to the tray along a first rotating direction, so as to activate the tray to approach the first module and couple the second module with the first module, the second cam portion abuts against and slides on the first fixing member when the handle member is rotated relative to the tray along a second rotating direction opposite to the first rotating direction, so as to activate the tray to separate from the first module and decouple the second module from the first module.

7. The server system of claim 6, wherein the tray further comprises a second pivot holding member, the second pivot holding member is disposed on the main tray body, the handle member further comprises a second pivotal member, the second linkage portion and the first linkage portion are symmetric relative to a geometric center of the handle portion, and the second linkage portion is pivoted to the second pivot holding member by the second pivotal member.

8. The server system of claim 7, wherein the handle member has a third cam portion and a fourth cam portion, the third cam portion and the fourth cam portion are disposed on the other end of the second linkage portion, and the assembly mechanism further comprises:
 a second fixing member fixed on the frame mechanism, the third cam portion abuts against and slides on the second fixing member when the handle member is rotated relative to the tray along the first rotating direction, so as to activate the tray to approach the first module, the fourth cam portion abuts against and slides on the second fixing member when the handle member is rotated relative to the tray along the second rotating direction, so as to activate the tray to separate from the first module, wherein the second pivotal member is coaxial with the first pivotal member, and the second fixing member is coaxial with the first fixing member.

9. The server system of claim 6, wherein a first containing space, a second containing space and a third containing space are formed between the tray and the second module, the first containing space, the second containing space and the third containing space communicate with one another, and the first containing space, the second containing space and the third containing space accommodate the first linkage portion, the second linkage portion and the handle portion when the handle member is rotated to an accommodating position along the first rotating direction.

10. The server system of claim 6, wherein the assembly mechanism further comprises:
 a push-push latch mechanism disposed on the handle portion, the push-push latch mechanism being for latching the handle portion in the third containing space or releasing the handle portion from the third containing space.

* * * * *